(12) United States Patent
Shinkai et al.

(10) Patent No.: US 9,343,416 B2
(45) Date of Patent: May 17, 2016

(54) SEMICONDUCTOR DEVICE EMPLOYING WAFER LEVEL CHIP SIZE PACKAGE TECHNOLOGY

(75) Inventors: Hiroyuki Shinkai, Kyoto (JP); Hiroshi Okumura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 100 days.

(21) Appl. No.: 12/003,422

(22) Filed: Dec. 26, 2007

(65) Prior Publication Data
US 2009/0160049 A1    Jun. 25, 2009

(30) Foreign Application Priority Data
Dec. 25, 2006  (JP) ................. 2006-348570

(51) Int. Cl.
*H01L 23/48* (2006.01)
*H01L 23/00* (2006.01)

(52) U.S. Cl.
CPC ......... *H01L 24/13* (2013.01); *H01L 2224/0401* (2013.01); *H01L 2224/05541* (2013.01); *H01L 2224/05559* (2013.01); *H01L 2224/05572* (2013.01); *H01L 2224/13006* (2013.01); *H01L 2224/13023* (2013.01); *H01L 2224/13099* (2013.01); *H01L 2224/16* (2013.01); *H01L 2924/0002* (2013.01); *H01L 2924/014* (2013.01); *H01L 2924/01006* (2013.01); *H01L 2924/01013* (2013.01); *H01L 2924/01022* (2013.01); *H01L 2924/01024* (2013.01); *H01L 2924/01029* (2013.01); *H01L 2924/01033* (2013.01); *H01L 2924/01074* (2013.01); *H01L 2924/01079* (2013.01); *H01L 2924/10253* (2013.01)

(58) Field of Classification Search
CPC ................. H01L 2224/13099; H01L 2224/16; H01L 2924/0002; H01L 24/13
USPC .................................... 257/779–784
See application file for complete search history.

(56) References Cited

U.S. PATENT DOCUMENTS

| 4,434,434 | A | * | 2/1984 | Bhattacharya et al. ........ 257/737 |
| 5,268,072 | A | * | 12/1993 | Agarwala et al. ............... 216/13 |
| 5,834,844 | A | | 11/1998 | Akagawa et al. |
| 5,960,308 | A | | 9/1999 | Akagawa et al. |
| 6,133,136 | A | * | 10/2000 | Edelstein et al. ............. 438/618 |
| 6,501,185 | B1 | * | 12/2002 | Chow et al. ................... 257/780 |
| 6,620,720 | B1 | * | 9/2003 | Moyer et al. .................. 438/612 |

(Continued)

FOREIGN PATENT DOCUMENTS

| CN | 1392607 A | 1/2003 |
| JP | 59-148352 | 8/1984 |
| JP | 06-268201 A | 9/1994 |
| JP | 8340002 | 12/1996 |
| JP | 2000-164617 | 6/2000 |
| JP | 2005-333007 A | 12/2005 |

*Primary Examiner* — Ori Nadav
(74) *Attorney, Agent, or Firm* — Rabin & Berdo, P.C.

(57) ABSTRACT

A semiconductor device of the present invention includes a semiconductor chip; an internal pad for electrical connection formed on a surface of the semiconductor chip; a stress relaxation layer formed on the semiconductor chip and having an opening for exposing the internal pad; a connection pad made of a metal having solder wettability, formed on a part facing the opening of the internal pad and provided with a protruding portion protruding on the stress relaxation layer; a metal flange made of a metal having solder wettability, encompassing the periphery of the protruding portion and formed with a smaller thickness than a protruding amount of the protruding portion onto the stress relaxation layer; and a solder terminal for electrical connection with outside formed on the protruding portion and the metal flange.

19 Claims, 12 Drawing Sheets

(56) References Cited

U.S. PATENT DOCUMENTS

| | | | |
|---|---|---|---|
| 6,914,332 B2 * | 7/2005 | Zuniga-Ortiz et al. | 257/737 |
| 7,141,885 B2 * | 11/2006 | Kim | 257/779 |
| 7,465,654 B2 * | 12/2008 | Chou | H01L 23/53238 257/E21.476 |
| 7,638,406 B2 * | 12/2009 | Edelstein et al. | 438/381 |
| 7,642,647 B2 | 1/2010 | Minda | |
| 7,902,679 B2 * | 3/2011 | Lin et al. | 257/778 |
| 2005/0042872 A1 * | 2/2005 | Chien et al. | 438/689 |
| 2005/0258540 A1 * | 11/2005 | Minda | 257/738 |

\* cited by examiner

SEMICONDUCTOR DEVICE EMPLOYING WAFER LEVEL CHIP SIZE PACKAGE TECHNOLOGY

BACKGROUND OF THE INVENTION

1. Field of the Invention

The present invention relates to a semiconductor device to which a Wafer Level-Chip Size Package (WL-CSP) technology is applied.

2. Description of Related Arts

Recently, as semiconductor devices become increasingly more sophisticated and multifunctional, commercialization of Wafer Level-Chip Size Package (hereinafter referred to as WL-CSP) technology has progressed as well. With WL-CSP technology, the packaging process is completed at the wafer-level, and the size of an individual chip cut out by dicing reaches the size of the package.

Figure 8:
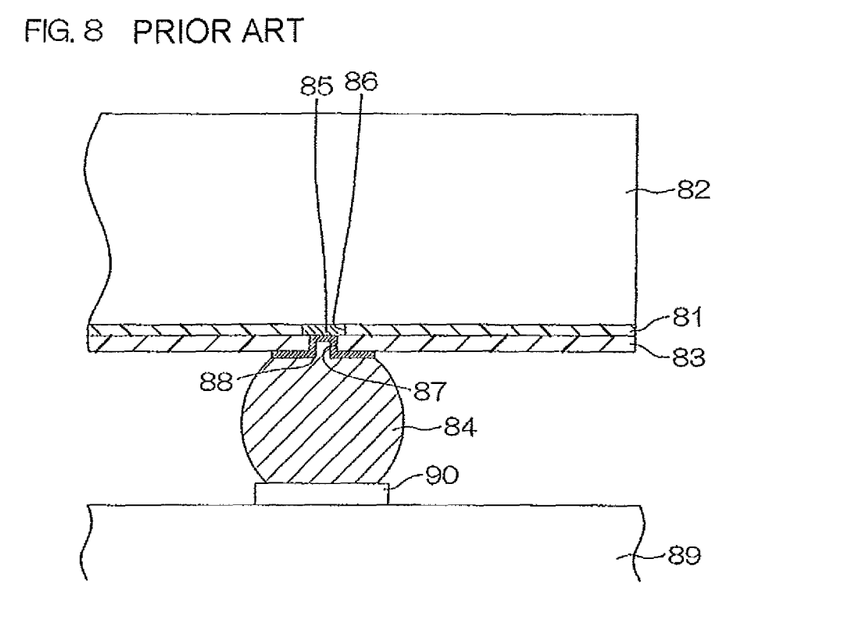
FIG. 8 is a schematic sectional view showing a configuration of a conventional semiconductor device and showing a state in which the semiconductor device is mounted on a mounting board.

A semiconductor device to which the WL-CSP technology is applied includes a semiconductor chip 82 with its surface covered by a surface protective film 81, a stress relaxation layer 83 laminated on the surface protective film 81 and a generally spherical solder ball 84 arranged on the stress relaxation layer 83, as shown in FIG. 8. The surface protective film 81 is formed with a pad opening 86 for exposing a part of internal wiring in the semiconductor chip 82 as an electrode pad 85. The stress relaxation layer 83 is formed with a through-hole 87 for exposing the electrode pad 85 exposed from the pad opening 86.

An under-bump layer 88 is formed so as to cover a surface of the electrode pad 85, an inner face of the through-hole 87 and a circumference of the through-hole 87 on the surface of the stress relaxation layer 83. The solder ball 84 is provided on a surface of the under-bump layer 88, and electrically connected with the electrode pad 85 via the solder ball 84. Mounting of the semiconductor device on a mounting board 89 (electrical and mechanical connection relative to the mounting board) is achieved by connecting the solder ball 84 to a pad 90 on the mounting board 89.

With the semiconductor device mounted on the mounting board 89, the solder ball 84 is sandwiched between the under-bump layer 88 on the semiconductor chip 82 and the pad 90 on the mounting board 89 to be firmly fixed thereon. In the relationship with the under-bump layer 88, however, the solder ball 84 contacts only the surface of the under-bump layer 88. As a result, there may have been a concern that when stress resulting from thermal expansion/contraction of the semiconductor chip 82 or the mounting board 89 is generated on the solder ball 84, the vicinity of a joint interface with the under-bump layer 88 of the solder ball 84 is cracked due to the stress. In addition, there may also have been a concern that the solder ball 84 is stripped off from the under-bump layer 88 due to the stress caused on the solder ball 84 since a contact area between the solder ball 84 and the under-bump layer 88 is small.

In particular, in a semiconductor device of a Land Grid Array (LGA) type, solder cannot be spread to soak over a side face of an under-bump layer since the volume of a solder ball (a solder pad) is small. As a result, a crack due to stress caused on the solder pad is easily generated. Further, it is difficult to obtain an adequate adhesive strength of the solder pad to the under-bump layer (a semiconductor chip).

SUMMARY OF THE INVENTION

Accordingly, an object of the present invention is to provide a semiconductor device capable of relaxing stress generated on a solder terminal and also improving the adhesive strength to a semiconductor chip, and preventing the solder terminal from stripping.

A semiconductor device of the present invention includes a semiconductor chip; an internal pad for electrical connection formed on a surface of the semiconductor chip; a stress relaxation layer formed on the semiconductor chip and having an opening for exposing the internal pad; a connection pad made of a metal having solder wettability, formed on a part facing the opening of the internal pad and provided with a protruding portion protruding on the stress relaxation layer; a metal flange made of a metal having solder wettability, encompassing the periphery of the protruding portion and formed with a smaller thickness than a protruding amount of the protruding portion onto the stress relaxation layer; and a solder terminal for electrical connection with outside formed on the protruding portion and the metal flange.

According to this configuration, the connection pad arranged in the opening of the stress relaxation layer is made of a metal having solder wettability and is formed in a shape provided with the protruding portion protruding on the stress relaxation layer from the opening. Around the protruding portion, the metal flange made of a metal having solder wettability is formed to encompass the protruding portion. The solder terminal for electrical connection with the outside is formed on the protruding portion of the connection pad and the metal flange. Accordingly, an entire surface (a distal end and a side face) of the protruding portion and the metal flange are covered with the solder terminal.

The semiconductor device is mounted on an external mounting board by connecting the solder terminal to a pad mounted thereon. Even if stress derived from thermal expansion/contraction of the semiconductor chip or the mounting board is generated on the solder terminal in this mounting state, the solder terminal is formed so as to cover the entire surface (the distal end and the side face) of the protruding portion. Accordingly, the protruding portion protrudes in the interior of the solder terminal, thus a part of the stress can be relaxed by the protruding portion protruding in the interior of the solder terminal. Therefore, generation of a crack on the solder terminal can be prevented. Moreover, since the solder terminal is attached to the connection pad with a sufficient adhesive strength, there is no possibility that the solder terminal is stripped off from the connection pad. As a result, a semiconductor device with high connection reliability can be achieved.

Additionally, in this configuration, solder can be spread to soak over the periphery of the protruding portion easily by forming the metal flange. Therefore, even when there is a need to reduce an amount of solder which is a material for the solder terminal, such as in the so-called semiconductor device of the LGA type wherein a generally semi-spherical solder terminal (solder pad) is used, the small amount of solder can be spread to soak over the side face of the protruding portion of the connection pad. That is, even a solder terminal with a small volume can be attached to the entire surface (the distal end and the side face) of the protruding portion. As a result, a semiconductor device with much higher connection reliability can be achieved.

The above, or other objects, features and effects of the present invention will become apparent from the following explanation of embodiments with reference to the accompanying drawings.

DETAILED DESCRIPTION OF THE PREFERRED EMBODIMENTS

Figure 1:
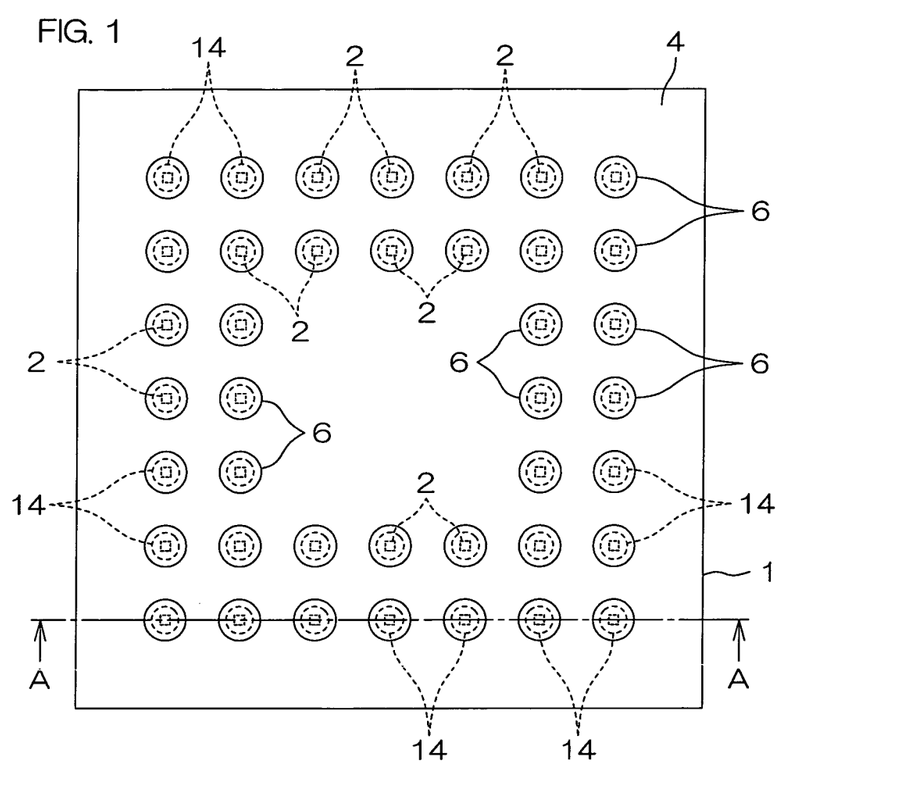
FIG. 1 is a schematic bottom plan view of a semiconductor device in accordance with a first embodiment of the present invention.
Figure 2:
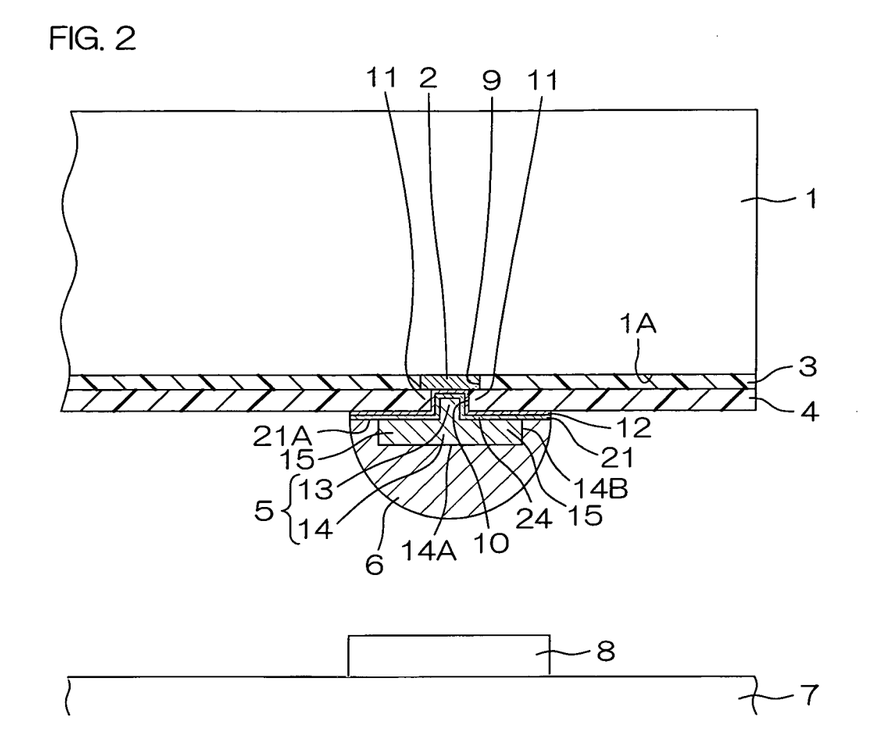
FIG. 2 is a sectional view taken along line A-A of FIG. 1.

FIG. 1 is a schematic bottom plan view (illustrating a joint surface onto a mounting board) of a semiconductor device in accordance with a first embodiment of the present invention. FIG. 2 is a sectional view taken along line A-A shown in FIG. 1. In FIG. 2, the semiconductor device is illustrated with its part omitted by breaking the semiconductor device with a break line.

The semiconductor device is manufactured by WL-CSP technology. The semiconductor device includes a semiconductor chip 1, a surface protective film 3 covering a function face 1A (a face where a function element is built) of the semiconductor chip 1, a stress relaxation layer 4 formed on the surface protective film 3, a connection pad 5 formed on the stress relaxation layer 4, and a solder pad 6 (a solder terminal) attached to the connection pad 5 for electrical connection with the outside. Mounting of the semiconductor device onto a mounting board 7 (electrical and mechanical connection to the mounting board 7) is achieved by connecting the solder pad 6 to a pad 8 on the mounting board 7.

The semiconductor chip 1 is, for example, a generally rectangular silicon chip when viewed in plan view. The function face 1A is formed with a plurality of electrode pads 2 (inner pads).

The electrode pads 2 are, for example, generally rectangular aluminum pads when viewed in plan view, and electrically connected with the function element built on the function face 1A of the semiconductor chip 1. Further, the electrode pads 2 are arranged in two rows rectangularly and annularly when viewed in plan view along an outer periphery of the semiconductor chip 1. An appropriate spacing is provided between individual adjacent electrode pads 2 to each other (see FIG. 1).

The surface protective film 3 is made of silicon oxide or silicon nitride. The surface protective film 3 is formed with a pad opening 9 for exposing each electrode pad 2.

The stress relaxation layer 4 is made of polyimide, for example. The stress relaxation layer 4 is formed so as to cover an entire surface of the surface protective film 3 and has a function of absorbing and relaxing the stress applied on the semiconductor device. In addition, the stress relaxation layer 4 is formed with a through-hole 10 (an opening) penetrating therethrough at a position opposed to each electrode pad 2. The electrode pad 2 exposed from the pad opening 9 faces the outside through the through-hole 10. An under-bump layer 12 made of titanium, chromium, titanium tungsten, or the like, for example, is formed so as to cover a surface of the electrode pad 2, an inner face of the through-hole 10 and a circumference 11 of the through-hole 10 on a surface of the stress relaxation layer 4.

An outer copper film 24 is laminated on the under-bump layer 12. The outer copper film 24 is formed using a metal having solder wettability, for example, copper. Further, the outer copper film 24 is formed generally circular when viewed in plan view and, for example, having a thickness of 2 to 3 μm.

The connection pad 5 is formed on the outer copper film 24. The connection pad 5 is formed using a metal having solder wettability, for example, copper. The connection pad 5 includes a buried portion 13 buried in the through-hole 10 and a protruding portion 14 integrally formed with the buried portion 13 and protruding on the stress relaxation layer 4.

The buried portion 13 is formed, for example, cylindrically, and electrically connected with the electrode pad 2 via the under-bump layer 12 and the outer copper film 24.

The protruding portion 14 is formed, for example, in the shape of a cylinder having a height of 10 to 50 μm from the surface of the outer copper film 24. Further, the protruding portion 14 is formed such that a width (diameter) in a direction orthogonal to a laminating direction of the semiconductor chip 1 and the stress relaxation layer 4 (hereinafter referred to as simply "a laminating direction") is larger (wider) than an opening width (diameter) of the through-hole 10 in the same direction. Therefore, a circumference 15 of the protruding portion 14 projects to a direction orthogonal to the laminating direction and is opposed to the surface of the stress relaxation layer 4 in the laminating direction via the under-bump layer 12 and the outer copper film 24. In addition, the protruding portion 14 is formed such that the width (diameter) in the direction orthogonal to the laminating direction is smaller than a width (diameter) of the outer copper film 24 in the same direction. As a result, a circumference 21 of the outer copper film 24 projects laterally to the protruding portion 14, encompasses the periphery of the protruding portion 14 and constitutes a metal flange formed in a smaller thickness than a protruding amount of the protruding portion 14 onto the stress relaxation layer 4.

The solder pad 6 is formed, for example, generally semi-spherically using solder, and covers an entire surface (a distal end face 14A and a side face 14B) of the protruding portion 14 of the connection pad 5 and a surface 21A of the circumference 21 of the outer copper film 24.

FIG. 3A to 3G are schematic sectional views showing a manufacturing method of the semiconductor device shown in FIG. 1.

Figure 3A:
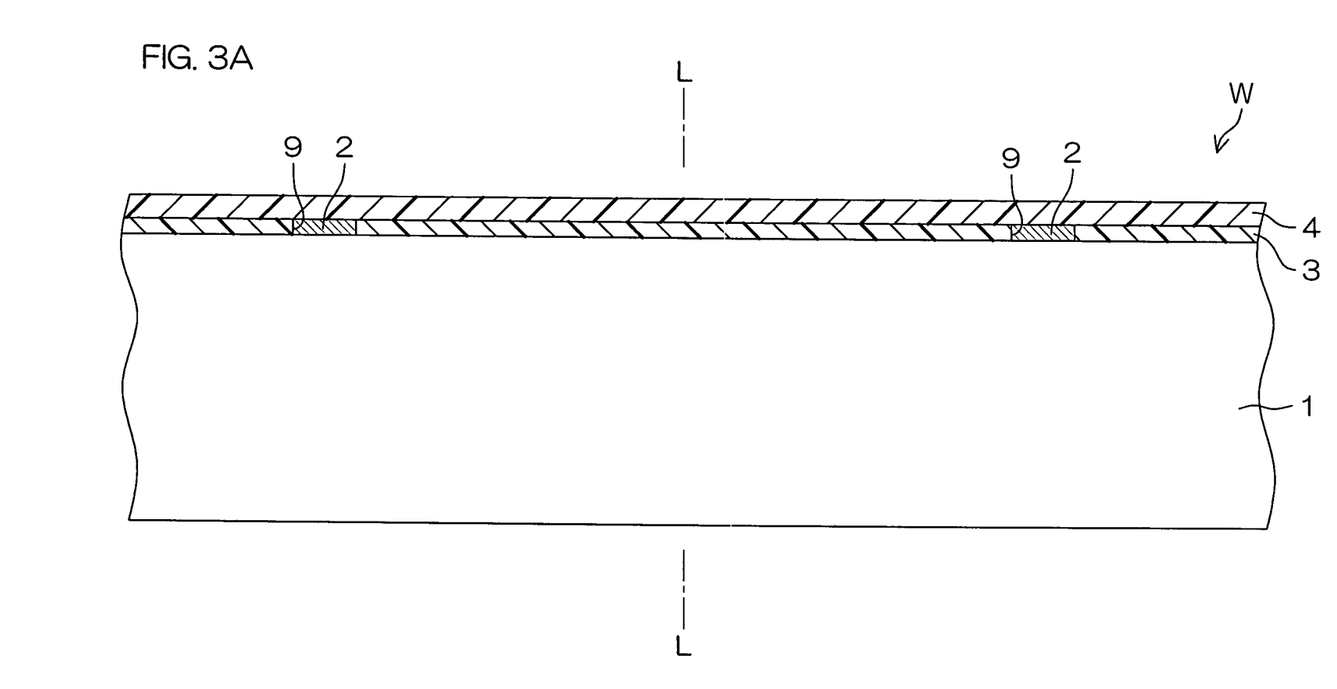
FIG. 3A is a schematic sectional view showing a manufacturing method of the semiconductor device in FIG. 1 in process order.

In manufacturing the semiconductor device, first, a plurality of semiconductor chips 1 are made, as shown in FIG. 3A, to prepare a semiconductor wafer W with the entire surface of the semiconductor chips 1 covered by the surface protective film 3. Further, the surface protective film 3 is formed with the pad opening 9 exposing the electrode pad 2. In a state of the semiconductor wafer W, the stress relaxation layer 4 is formed on the surface protective film 3.

Figure 3B:
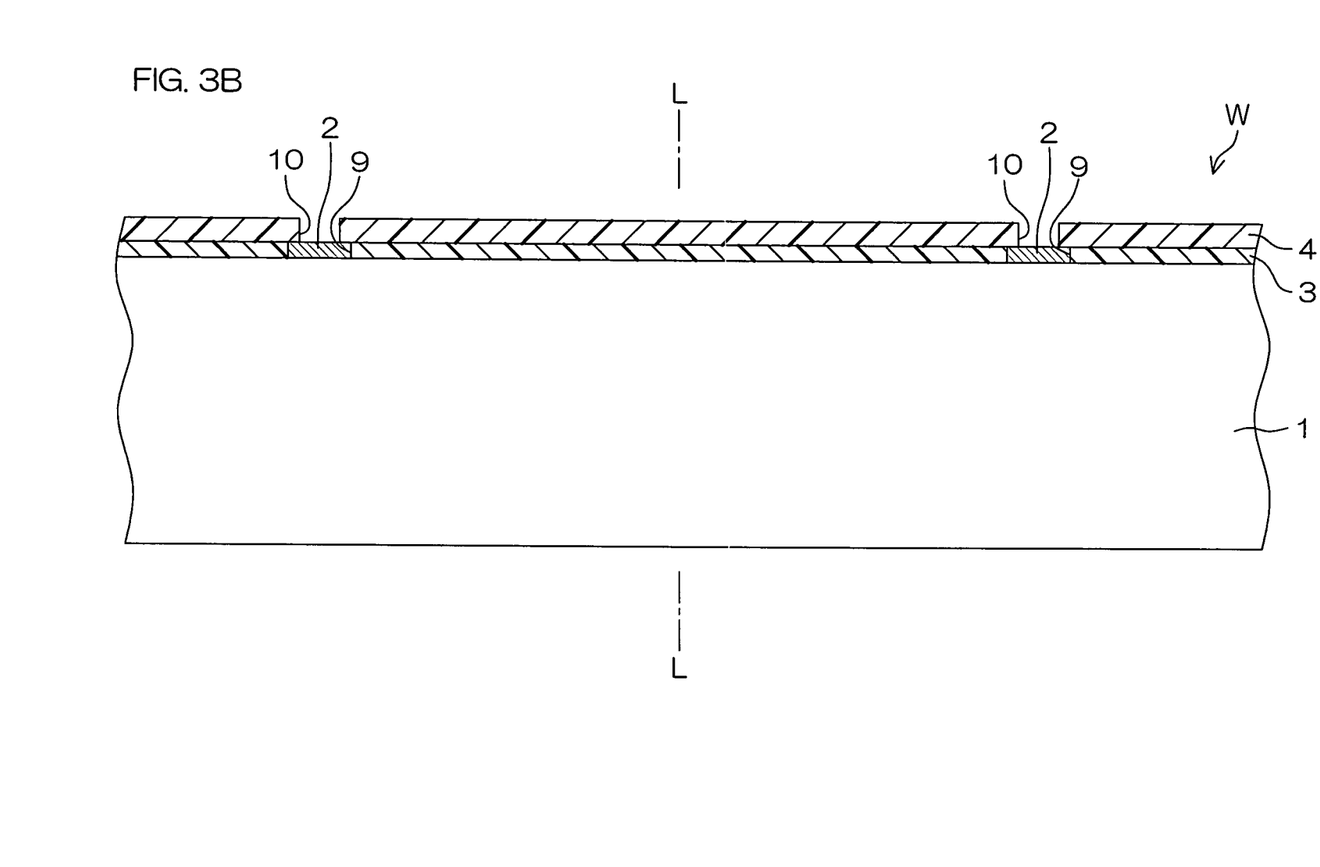
FIG. 3B is a schematic sectional view showing the manufacturing method of the semiconductor device in FIG. 1 in process order and showing the subsequent process of FIG. 3A.

Next, the through-hole 10 is formed on the stress relaxation layer 4 as shown in FIG. 3B.

Figure 3C:
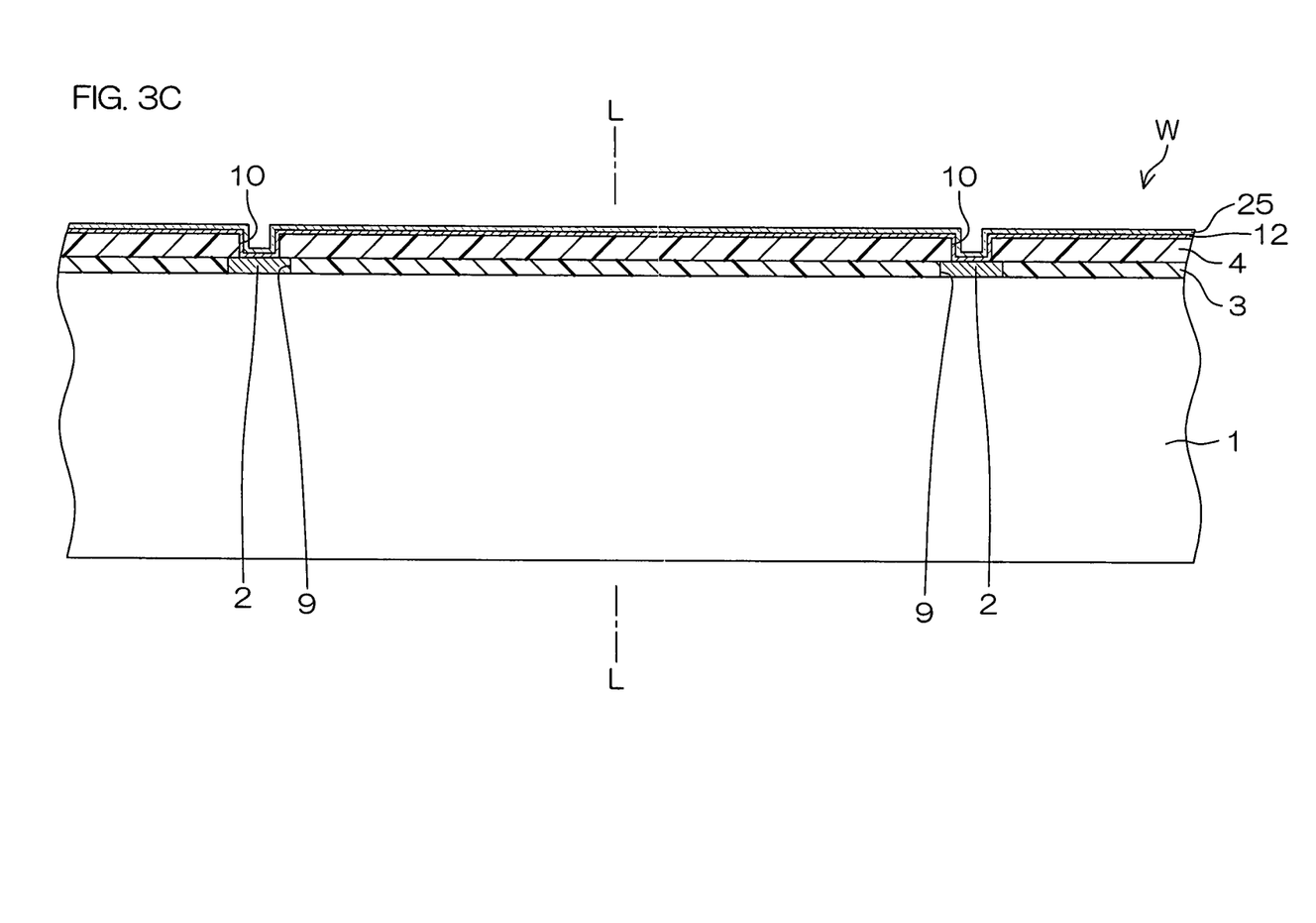
FIG. 3C is a schematic sectional view showing the manufacturing method of the semiconductor device in FIG. 1 in process order and showing the subsequent process of FIG. 3B.

After the through-hole 10 is formed, the under-bump layer 12 and a copper film 25 are formed on the semiconductor wafer W in this order, for example, by a sputtering method, as shown in FIG. 3C.

Figure 3D:
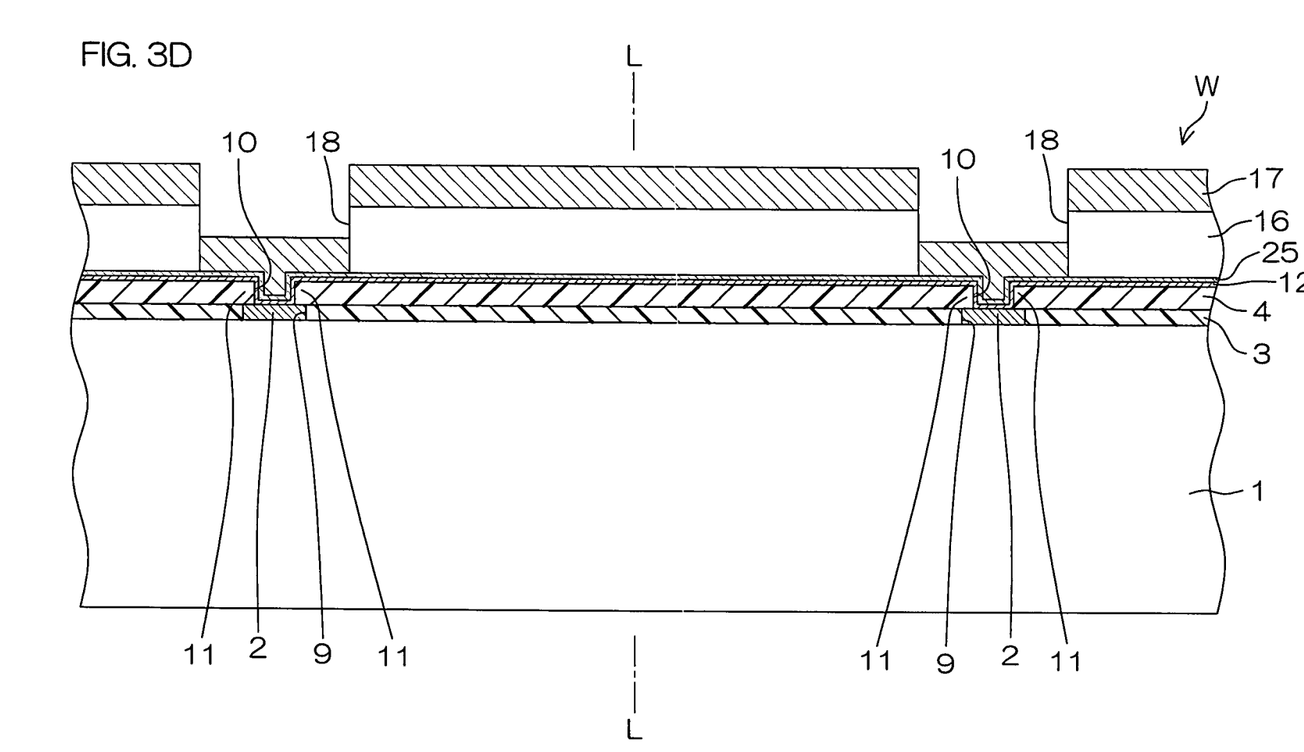
FIG. 3D is a schematic sectional view showing the manufacturing method of the semiconductor device in FIG. 1 in process order and showing the subsequent process of FIG. 3C.

Next, a photoresist 16 and a metal layer 17 are formed on the copper film 25, as shown in FIG. 3D. More specifically, the photoresist 16 having an opening 18 at an area on which the protruding portion 14 of the connection pad 5 is to be formed is formed on the copper film 25 by a known photolithography technology, first. After the photoresist 16 is formed, the metal layer 17 made of copper used as a material for the connection pad 5 is formed on the whole area of the semiconductor wafer W by the sputtering method. After that, an unnecessary part (a part except for the connection pad 5) of the metal layer 17 is lifted off with the photoresist 16 by removing the latter. By this means, the connection pad 5 is formed.

Figure 3E:
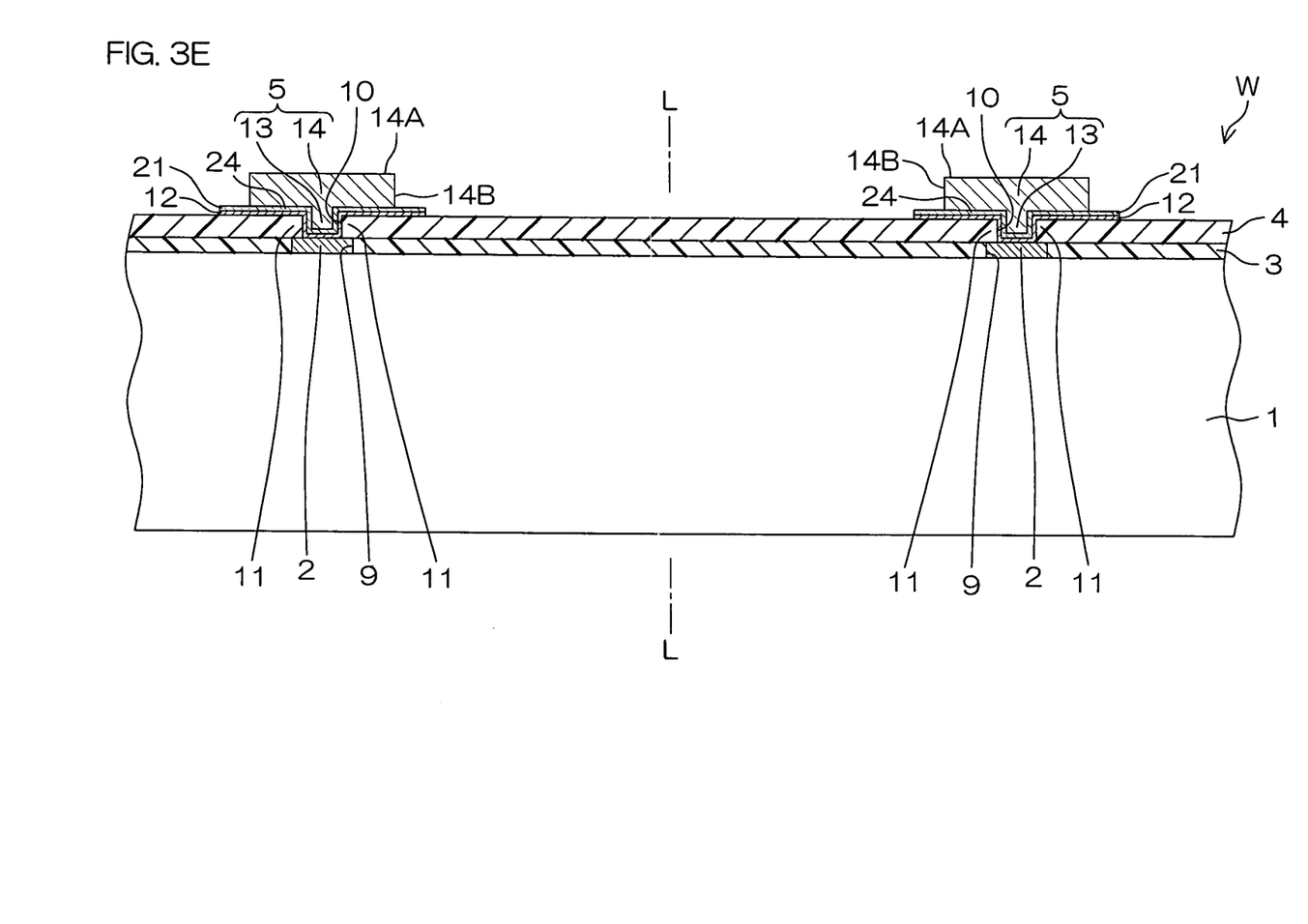
FIG. 3E is a schematic sectional view showing the manufacturing method of the semiconductor device in FIG. 1 in process order and showing the subsequent process of FIG. 3D.

Next, as shown in FIG. 3E, an unnecessary part (a part except for the part on which the outer copper film 24 is to be formed) of the copper film 25 and the under-bump layer 12 exposed from the connection pad 5 is removed by etching, so that the metal flange is formed including the circumference 21 of the outer copper film 24 encompassing the protruding portion 14 of the connection pad 5.

Figure 3F:
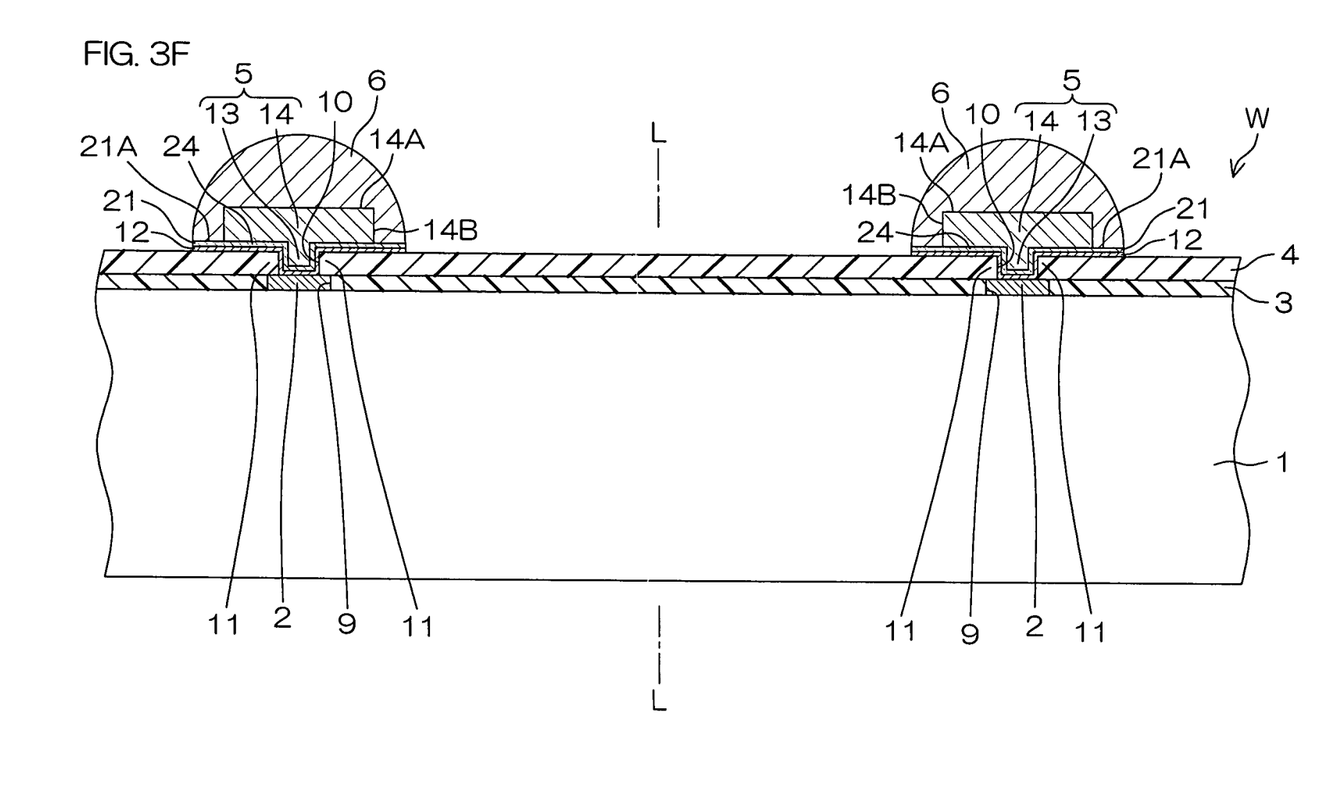
FIG. 3F is a schematic sectional view showing the manufacturing method of the semiconductor device in FIG. 1 in process order and showing the subsequent process of FIG. 3E.
Figure 3G:
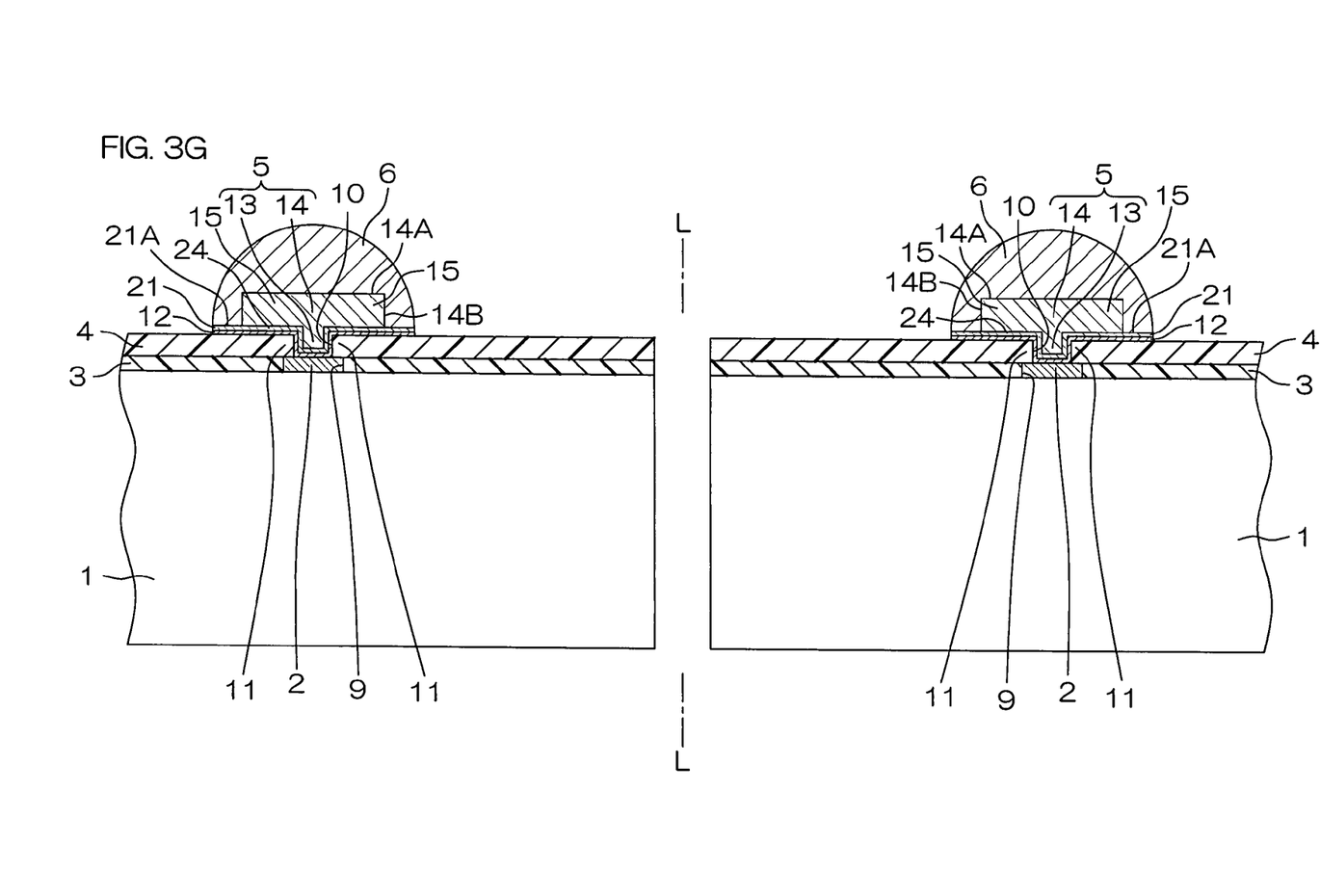
FIG. 3G is a schematic sectional view showing the manufacturing method of the semiconductor device in FIG. 1 in process order and showing the subsequent process of FIG. 3F.

Subsequently, as shown in FIG. 3F, the solder pad 6 covering the entire surface (the distal end face 14A and the side face 14B) of the protruding portion 14 of the connection pad 5 and the surface 21A of the circumference 21 of the outer copper film 24 is formed by attaching solder to the entire surface (the distal end face 14A and the side face 14B) of the protruding portion 14 and the surface 21A of the circumference 21 of the outer copper film 24. Then, as shown in FIG. 3G, the semiconductor wafer W is cut (diced) along a dicing line L which is set between each semiconductor chip 1 in the semiconductor wafer W, whereby the semiconductor device in the configuration shown in FIG. 1 is obtained.

In the semiconductor device, as described above, the connection pad 5 arranged in the through-hole 10 of the stress relaxation layer 4 is made of a metal having solder wettability (for example, copper) and is formed in a shape having the protruding portion 14 protruding on the stress relaxation layer 4 from the through-hole 10. Around the protruding portion 14, the circumference 21 of the outer copper film 24 made of a metal having solder wettability (for example, copper) is formed to encompass the protruding portion 14. The solder pad 6 is formed on the entire surface (the distal end face 14A and the side face 14B) of the protruding portion 14 and the circumference 21 of the outer copper film 24. As a result, the entire surface (the distal end face 14A and the side face 14B) of the protruding portion 14 and the circumference 21 of the outer copper film 24 are covered by the solder pad 6.

The semiconductor device is mounted on the external mounting board 7 by connecting the solder pad 6 to a pad 8 on the mounting board 7. Since the solder pad 6 is formed so as to cover the entire surface (the distal end face 14A and the side face 14B) of the protruding portion 14 so that the protruding portion 14 protrudes in the interior of the solder pad 6. As a result, even if stress resulting from thermal expansion/contraction of the semiconductor chip 1 or the mounting board 7 is generated on the solder pad 6 in this mounting state, a part of the stress can be relaxed by the protruding portion 14 protruding in the interior of the solder pad 6. Accordingly, generation of a crack on the solder pad 6 can be prevented. Furthermore, since the solder pad 6 is attached to the connection pad 5 with a sufficient adhesive strength, the solder pad 6 is secure from stripping off from the connection pad 5. As a result, a semiconductor device having high connection reliability can be achieved.

In addition, the circumference 21 of the outer copper film 24 is formed in the semiconductor device, so that solder can be spread to soak over the surroundings of the protruding portion 14 (the circumference 21) easily. Consequently, even when a need arises to reduce an amount of solder that is a material for the solder pad 6, such as in the so-called semiconductor device of the LGA type in which the semi-spherical solder pad 6 is used as with this semiconductor device, solder in a small amount can be spread to soak over the side face 14B of the protruding portion 14 of the connection pad 5. That is, even a solder pad 6 in a small volume can be attached to the entire surface (the distal end face 14A and the side face 14B) of the protruding portion 14. As a result, a semiconductor device having much higher connection reliability can be realized.

Further, the circumference 15 of the protruding portion 14 projects to the circumference 11 of the through-hole 10 of the stress relaxation layer 4. Consequently, when stress is relaxed by the protruding portion 14, the stress exerted on the protruding portion 14 can be transferred to the stress relaxation layer 4. Therefore, even if large stress is generated on the solder pad 6, the stress can be satisfactorily relaxed by the connection pad 5 and the stress relaxation layer 4, whereby generation of a crack on the semiconductor chip 1 can be prevented.

In addition, since the protruding portion 14 of the connection pad 5 is formed cylindrically, the side face 14B thereof has no sharp edges. Accordingly, the stress generated on the solder pad 6 can be dispersed and absorbed on the side face 14B of the protruding portion 14 (the cylinder).

Figure 4:
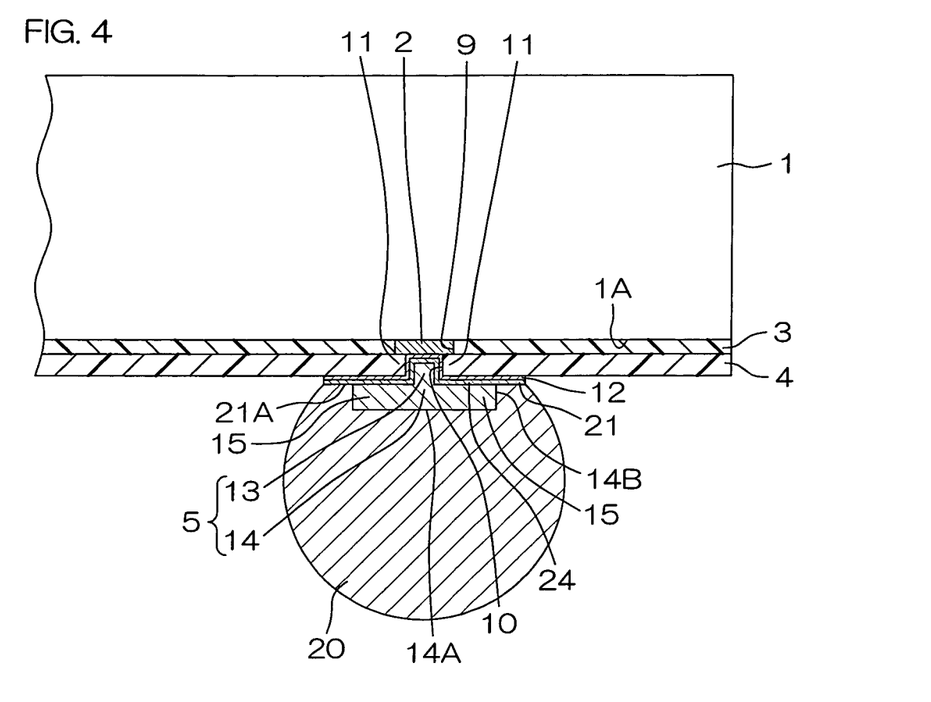
FIG. 4 is a schematic sectional view of a modification of the semiconductor device shown in FIG. 1, wherein a solder pad is in another configuration.

The solder terminal attached to the connection pad 5 is configured to be a generally semi-spherical solder pad 6 in the foregoing embodiment. However, the shape thereof is not limited to a generally semi-spherical shape if the solder terminal is connectable with the pad 8 on the mounting board 7. For example, the solder terminal may be a solder ball 20 formed into a generally spherical shape, as shown in FIG. 4.

As above, the embodiment of the present invention is explained. However, the present invention can be carried out in other embodiments.

Figure 5:
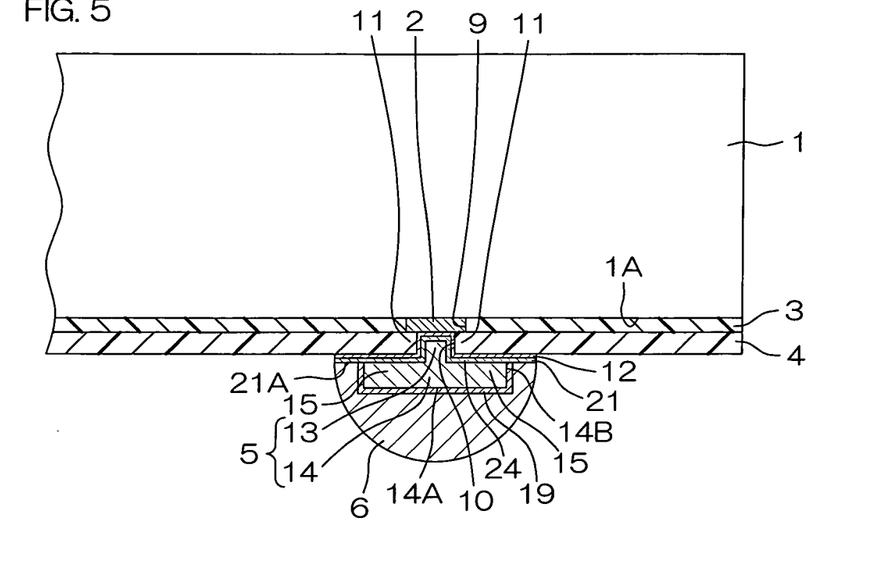
FIG. 5 is a schematic sectional view of a modification of the semiconductor device shown in FIG. 1, wherein a connection pad is in another configuration.

For example, the connection pad 5 is formed using copper in the foregoing embodiment. However, the material is not limited to copper if a metal has solder wettability. The connection pad 5 may be formed using gold, for example. In this case, it is preferable to form a diffusion prevention layer 19 made of nickel for preventing gold from being diffused, on an interface between the protruding portion 14 of the connection pad 5 and the solder pad 6, as shown in FIG. 5, for example.

Figure 6:
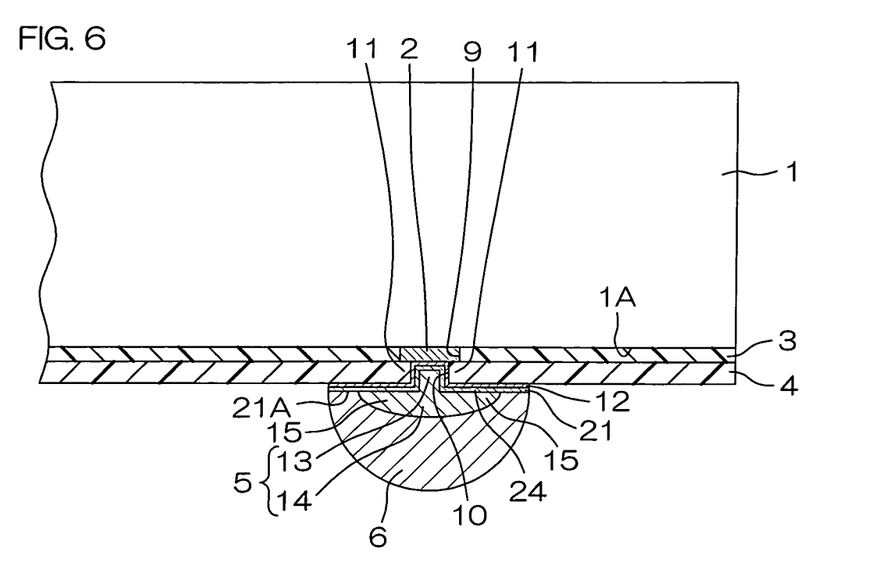
FIG. 6 is a schematic sectional view of a modification of the semiconductor device shown in FIG. 1, wherein a protruding portion of the connection pad is in another configuration.
Figure 7:
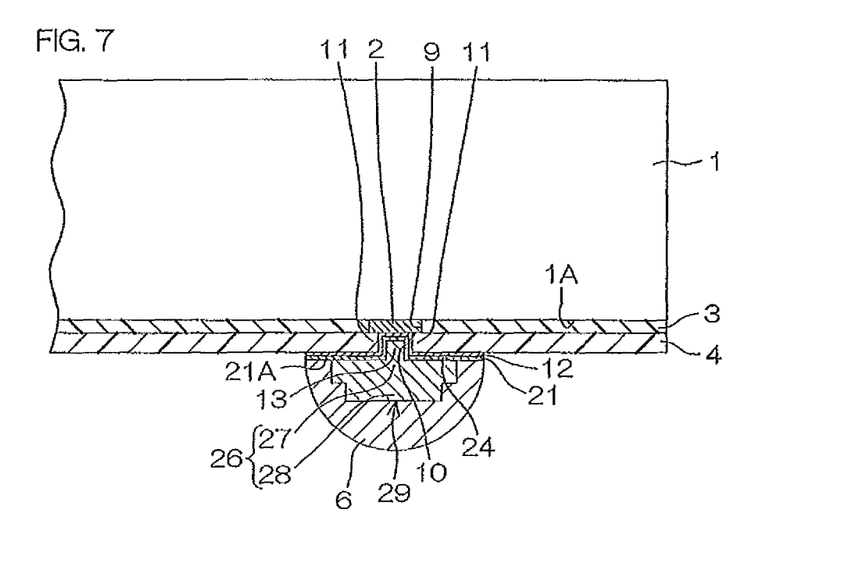
FIG. 7 is a schematic sectional view of a modification of the semiconductor device shown in FIG. 1, wherein the protruding portion of the connection pad is still in another configuration.

Further, although the protruding portion 14 of the connection pad 5 is formed cylindrically in the foregoing embodiment, for example, the connection pad 5 may be formed in a semi-elliptic spherical shape, as shown in FIG. 6. Still further, a metal pad 29 having a protruding portion 26 including an upper protruding portion 27 arranged at a side of the stress relaxation layer 4 in the laminating direction and a lower protruding portion 28 integrally formed on the underside of the upper protruding portion 27 may be formed instead of the connection pad 5, as shown in FIG. 7, for example.

Additionally, the connection pad 5 and the outer copper film 24 are formed separately in the foregoing embodiment. However, they may be formed integrally with the same material.

As for the configuration of the electrode pads 2 on the semiconductor chip 1 in the foregoing embodiment, the electrode pads 2 are arranged in two rows rectangularly annular when viewed in plan view and along the outer periphery of the semiconductor chip 1. However, the arrangement is not limited to being rectangularly annular and may be a matrix form, for example, if the electrode pads 2 are arranged regularly on the function face 1A of the semiconductor chip 1.

Furthermore, the semiconductor device of the WL-CSP type is given as an example in the above-mentioned embodiment. However, the present invention can be applied to a semiconductor device other than the semiconductor device of the WL-CSP type, wherein a semiconductor chip is mounted (bare-chip mounted) with its front side set to face a mounting board and its back side exposed.

Although the embodiments of the present invention are explained in detail, they are merely exemplary to clarify technical contents of the present invention. The present invention should not be construed as being limited to the embodiments, and the spirit and scope of the present invention is to be limited only by the scope of the appended claims.

The present application corresponds to Japanese patent application No. 2006-348570 filed with Japan Patent Office on Dec. 25, 2006. The entire disclosure thereof is hereby incorporated by reference.

What is claimed is:

1. A semiconductor device comprising:
   a semiconductor chip;
   an internal pad for electrical connection formed on a surface of the semiconductor chip;
   a stress relaxation layer formed on the semiconductor chip and having an opening for exposing the internal pad;
   a connection pad made of a metal having solder wetability, the connection pad being formed on the stress relaxation layer such that the connection pad faces the internal pad through the opening, the connection pad having a protruding portion protruding upward from the stress relaxation layer, the protruding portion being wider than the opening in the stress relaxation layer, and the connection pad having a T-shaped cross section;
   a metal flange made of a metal having solder wetability, the metal flange being formed between the stress relaxation layer and the connection pad such that the metal flange has an edge portion projecting laterally with respect to the protruding portion; and
   a solder terminal for electrical connection with outside, the solder terminal making a solder joint with both the protruding portion and the edge portion of the metal flange,
   wherein all of an upper surface of the connection pad, a lower surface of the connection pad, and an upper surface of the metal flange which is arranged on the stress relaxation layer, are substantially flat and are disposed substantially parallel to the stress relaxation layer,
   wherein the T-shaped cross section of the connection pad includes a horizontal portion having a rectangular shape wider than the internal pad and extending substantially parallel to the stress relaxation layer and a vertical portion having a square portion in the opening of the stress relaxation layer and extending from the horizontal portion in a thickness direction of the stress relaxation layer,
   wherein the solder terminal covers a side surface of the horizontal portion of the connection pad and is in direct contact with an outer edge of the metal flange, and
   wherein the solder terminal has a peripheral portion that extends laterally over an annular portion of the upper surface of the metal flange, from the side surface of the horizontal portion of the connection pad to a position flush with a side edge of the metal flange.

2. The semiconductor device according to claim 1, further comprising:
   an under-bump layer formed between the stress relaxation layer and the metal flange such that the under-bump layer covers the internal pad.

3. The semiconductor device according to claim 1, wherein the solder terminal is formed semi-spherically.

4. The semiconductor device according to claim 2, wherein:
   the under-bump layer projects laterally to the protruding portion such that the under-bump layer has a side surface flush with a side surface of the metal flange, and
   the solder terminal selectively makes a solder joint with the metal flange such that no solder joint is made between the under-bump layer and the solder terminal.

5. The semiconductor device according to claim 1, wherein a thickness of the metal flange is 2 to 3 μm.

6. The semiconductor device according to claim 1, wherein the connection pad is made of a material selected from the group consisting of copper and gold.

7. The Semiconductor device according to claim 1, wherein a thickness of the protruding portion from a surface of the metal flange is 10 to 50 μm.

8. The semiconductor device according to claim 1, wherein the protruding portion includes an upper protruding portion arranged at a side of the stress relaxation layer and a lower protruding portion integrally formed on an underside of the upper protruding portion.

9. The semiconductor device according to claim 1, wherein the protruding portion is formed cylindrically.

10. The semiconductor device according to claim 1, wherein the protruding portion is formed in a semi-elliptic spherical shape.

11. The semiconductor device according to claim 1, wherein the connection pad includes a buried portion buried in the opening of the stress relaxation layer and formed cylindrically.

12. The semiconductor device according to claim 1, wherein the connection pad is formed with a material same as a material of the metal flange.

13. The semiconductor device according to claim 1, wherein the connection pad is made of gold and a surface of the connection pad is covered with nickel.

14. The semiconductor device according to claim 1, including a semiconductor device of the WL-CSP type in which a side surface of the semiconductor chip is flush with a side surface of the stress relaxation layer.

15. The semiconductor device according to claim 1, wherein the opening of the stress relaxation layer is formed such that the opening penetrates the stress relaxation layer along a direction parallel to a side surface of the semiconductor chip.

16. The semiconductor device according to claim 1, wherein the opening of the stress relaxation layer has a side surface perpendicular to the surface of the semiconductor chip, and the semiconductor device further includes an under-bump layer formed on the stress relaxation layer, the under-bump layer being partly conformal to the side surface of the opening.

17. The semiconductor device according to claim 1, wherein the metal flange has a thickness smaller than a protruding amount of the protruding portion.

18. A semiconductor device comprising:

a semiconductor chip having a first connection pad;

at least one insulating layer on the chip, the at least one insulating layer including a stress relaxation layer, the at least one insulating layer having an opening to the first connection pad and an inner end at the first connection pad, the inner end of the opening having a predetermined width;

at least one metal layer having a central portion that extends through the opening and contacts the first connection pad of the chip, the at least one metal layer additionally having a peripheral portion that extends substantially parallel to the stress relaxation layer, the peripheral portion of the at least one metal layer having a flange with an outer periphery;

a second connection pad having an extending portion that extends through the opening and contacts the central portion of the at least one metal layer, the second connection pad additionally having a protruding portion that is overlapped by part of the stress relaxation layer on a first side of the opening by a predetermined horizontal distance and is also overlapped by another part of the stress relaxation layer on a second side of the opening by a predetermined horizontal distance, the second side being opposite the first side, and the second connection pad having a T-shaped cross section;

a solder terminal for electrical connection to a conductor on a circuit board, the solder terminal making a joint with both the protruding portion of the second connection pad and the outer periphery of the flange, wherein the T-shaped cross section of the second connection pad includes a horizontal portion having a rectangular shape and extending substantially parallel to the stress relaxation layer and a vertical portion having a square portion in the opening of the stress relaxation layer and extending from the horizontal portion in a thickness direction of the stress relaxation layer, wherein the solder terminal is in direct contact with an outer edge of the flange, and wherein the solder terminal has a peripheral portion that extends laterally over an annular portion of a surface of the flange, from a side edge of the peripheral portion of the second connection pad to a position flush with a side edge of the flange.

19. The semiconductor device according to claim 18, wherein the protruding portion of the connection pad has a side that is opposite to the extending portion of the connection pad, all of the side of the connection paid that is opposite to the extending portion being substantially flat.

* * * * *